United States Patent [19]
Newman et al.

[11] Patent Number: 5,132,282
[45] Date of Patent: Jul. 21, 1992

[54] HIGH TEMPERATURE SUPERCONDUCTOR-STRONTIUM TITANATE SAPPHIRE STRUCTURES

[76] Inventors: Nathan Newman, 8149 Cabrillo Hwy., Montara, Calif. 94037; Kookrin Char, 704 Chimalus Dr., Palo Alto, Colo. 94306

[21] Appl. No.: 495,568

[22] Filed: Mar. 16, 1990

[51] Int. Cl.$^5$ .............................................. B32B 9/00
[52] U.S. Cl. .................................... 505/1; 505/701; 505/702; 505/703; 505/704; 428/688; 428/698; 428/701; 428/930
[58] Field of Search ................... 505/1, 701-704; 428/688, 698, 701, 901, 930

[56] References Cited

PUBLICATIONS

Multilayer $YBa_2Cu_3O_x$-$SrTiO_3$-$YBa_2Cu_3O_x$ Films for Insulating Crossovers, Kingston et al., Applied Physics Letters, Jan. 8, 1990.
$YBa_2Cu_3O_7$ Films Grown on Epitaxial MgO Buffer Layers on Sapphire, Talvacchio et al., Proceedings M$^2$S-HTSC, Stanford, Jul. 1989, Physica.
The Sputter Deposition and Characterization of Epitaxial Magnesium Oxide Thin Films and Their Use as a Sapphire/YBCO Buffer Layer, Morris et al., Proc. M.A.S. vol. 169, 1990.
Properties of Epitaxial $YBa_2Cu_3O_7$ Thin Films on $Al_2O_3$ (1012), Char et al., Appl. Phys. Lett. 56(8) Feb. 19, 1990, pp. 785-787.
Materials Research Bulletin, vol. 23, No. 8, Aug. 1988, pp. 1159-1162 Hu et al.
Journal of the Less Common Metals, vol. 151, pp. 333-340, Chambonnet et al. May 15, 1989.
Applied Physics Letters, vol. 55, No. 3, Jul. 17, 1989, pp. 295-297 Witanachchi et al.

Primary Examiner—Patrick J. Ryan

[57] ABSTRACT

A HTSC layered structure comprising a substrate such as sapphire, a strontium titanate buffer layer and a HTSC film such as $YBa_2Cu_3O_7$ provides a superconductor having lower surface resistance and a narrower transition temperature.

9 Claims, 4 Drawing Sheets

HIGH TEMPERATURE SUPERCONDUCTOR-STRONTIUM TITANATE SAPPHIRE STRUCTURES

DESCRIPTION

TECHNICAL FIELD

This invention relates to high critical temperature superconducting (HTSC) films and, more particularly, this invention relates to the preparation of HTSC films on sapphire (aluminum oxide) substrates by the use of stable, epitaxial buffer layers.

BACKGROUND OF THE INVENTION

The recent discovery of high critical temperature superconducting materials has created interest in the use of these materials in microwave devices. The HTSC metal cuprate materials cannot readily be produced in bulk with geometries and properties suitable for microwave devices. Presently, devices based on the HTSC materials are fabricated by formation of thin films on substrates by techniques similar to those used to fabricate semiconductor devices. To be useful in a microwave device the HTSC film must be grown on a substrate having low dielectric losses at high frequencies.

Silicon, a readily used substrate for semiconductor devices, cannot be used with the HTSC cuprate materials since at the temperature prevalent during deposition the cuprate reactants readily react with silicon. Sapphire ($Al_2O_3$) would appear to be an excellent substrate since it has a very low dielectric loss and is a strong, low cost, highly crystalline material available commercially in large sizes. Epitaxial films of a HTSC material such as $YBa_2Cu_3O_7$ can be grown on sapphire substrates. However, the optimum window of substrate temperatures during film deposition is relatively narrow [4]. At high temperatures, above about 700K, the $YBa_2Cu_3O_7$ thin film reacts with the sapphire, especially the Ba atoms. At low temperature, below about 650K, it is very difficult to produce thin $YBa_2Cu_3O_7$ films having good epitaxy.

There are other substrate materials that provide epitaxial growth of thin HTSC films with high superconducting transition temperatures and low rf surface resistance, such as strontium titanate ($SrTiO_3$), lanthanum aluminate ($LaAlO_3$), magnesium oxide (MgO) and yttria stabilized zirconia (YSZ). However, thick substrates of some of these materials, e.g. strontium titanate, exhibit too high an rf loss or do not have high enough mechanical strength to act as a substrate for large area microwave devices. Some of these substrates are not available in large sizes and/or are only available at high cost.

However, thin films of these epitaxial materials would not exhibit a high dielectric loss and would be useful as a buffer layer between the HTSC film and the sapphire substrate if they provided an epitaxial surface for the HTSC film and were stable and non-reactive with the HTSC film and the substrate.

LIST OF REFERENCES

1. Multilayer $YBa_2Cu_3O_x$ - $SrTiO_3$ - $YBa_2Cu_3O_x$ Films For Insulating Crossovers, Kingston et al., Applied Physics Letters, Jan. 8, 1990.
2. $YBa_2Cu_3O_7$ Films Grown on Epitaxial MgO Buffer Layers on Sapphire, Talvacchio et al., Proceedings $M^2S$-HTSC, Stanford, July 1989, Physica.
3. The Sputter Deposition and Characterization of Epitaxial Magnesium Oxide Thin Films and Their Use as a Sapphire/YBCO Buffer Layer, Morris et al., Proc. M.A.S. Vol 169, 1990.
4. Properties of Epitaxial $YBa_2Cu_3O_7$ Thin Films on $Al_2O_3$ {1012}, Char et al., Appl. Phys. Lett. 56(8) Feb. 19, 1990 p. 785-787.

STATEMENT OF THE PRIOR ART

Kingston et al. [1] disclose the use of $SrTiO_3$ as a buffer layer between two $YBa_2Cu_3O_x$ film and an MgO substrate. MgO is not the best substrate for microwave applications due to its high dielectric loss. MgO does not provide a fully compatible lattice match with HTSC films such as $YBa_2Cu_3O_7$ and polished MgO surfaces degrade in air with humidity. Talvacchio et al. [2] grew $YBa_2Cu_3O_7$ films on epitaxial MgO buffer layers on sapphire. This layered structure failed as a microwave device since the MgO was excessively moisture sensitive. The HTSC film did not have sufficient orientation and there were too many random grains. Morris et al. [3] formed an MgO buffer layer by sputter deposition at pressures between 5.5 to 7 Pa (about 40-50 m Torr). The resulting YBCO film grown on the epitaxial MgO has high normal state resistance and a broad superconducting transition.

STATEMENT OF THE INVENTION

It has been discovered that use of strontium titanate ($SrTiO_3$) as a buffer layer provides a HTSC layered structure on sapphire with the highest performance reported to date. Strontium titanate buffer layers provide an epitaxial film that has the optimum surface for growing high quality, high performance HTSC films. The $SrTiO_3$ buffer layer appears to be non-reactive with the barium ions in the YBaCuO layer.

The layered structure of the invention may include an additional epitaxial film between the surface of the sapphire substrate and the strontium titanate layer such as a thin, (100 Angstrom to 1000 Angstrom) intermediate film of magnesium oxide, lanthanum aluminate or yttria stabilized zirconia (YSZ).

The invention provides a HTSC buffer layered structure on sapphire that is stable and suitable for microwave environments. The good thermal characteristics of sapphire and the reduction of noise provided by the strontium titanate also makes the layered structure useful in fabricating bolometers (infrared detectors).

The HTSC film can be grown over a wide temperature range without the HTSC reacting with the sapphire substrate or the buffer reacting with the substrate or the HTSC film. The layered structure of the invention provides the highest performance of any sapphire supported HTSC film reported to date. Others have reported surface resistance measuring on a par with copper. The layered sapphire supported HTSC structures of the invention exhibit rf surface resistances 2 to 3 times better than copper at 10 GHz and 77K and much better than copper at lower temperatures. The YBCO films grown on the buffer layer exhibit low normal state resistance and a narrow superconducting transition.

The buffer layer in the HTSC structure of the invention is preferably grown in a high pressure process such as laser ablation or sputtering or metallo-organic compound vapor deposition (MOCVD). Talvacchio et al. [2] used electron beam deposition of an MgO film. Electron beam epitaxial deposition is conducted at relatively high vacuum, about $10^{-5}$ Torr. Morris et al. [3] deposited an MgO film at 40-50 m Torr. The low partial pressure of oxygen is believed to result in an oxygen deficient MgO buffer layer film. These films are chemically active and react with water which degrades the quality of the overlying HTSC film. Efforts to deposit lanthanum aluminate buffer layers were not successful.

The SrTiO$_3$ buffer layer in the layered structure of the invention is deposited at higher pressure which results in inert buffer layers with good epitaxial qualities. The SrTiO$_3$ buffer layers are excellent intermediate substrates for forming high performance, stable HTSC films.

These and many other objects and attendant advantages of the invention will become apparent as the invention becomes better understood by reference to the following and detailed descriptions when considered in conjunction with the accompanying drawings.

DETAILED DESCRIPTION OF THE INVENTION

Figure 1:
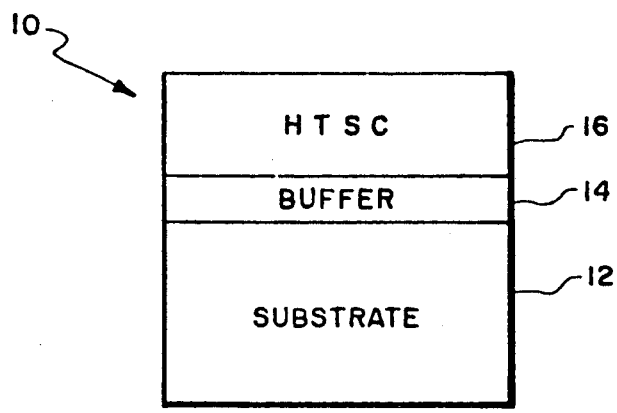
FIG. 1 is a schematic drawing of a layered HTSC-Buffer-Sapphire structure produced according to the process of this invention.

Referring now to FIG. 1, the layered structure 10 is composed of a sapphire base or substrate 12, a thin buffer layer 14 and a HTSC layer 16. The buffer layer 14 and the HTSC layer 16 may be laid down in a pattern to form a device by use of a mask formed by conventional photolithographic techniques or by use of shutters or shields.

Sapphire substrates are commercially available in high purity and in a variety of thicknesses and shapes. The support need only have sufficient thickness such as 0.1 millimeters to provide a mechanically strong substrate. Substrates having thicknesses above 1.0 millimeters would usually not be utilized since they add cost and weight to the device without providing any other benefit.

The strontium titanate buffer layer is an epitaxial layer having sufficient thickness such that the growth of HTSC film is influenced solely by the strontium titanate buffer layer and not by the sapphire substrate. The buffer layer has a minimum thickness to cover the sapphire surface and any anomalies on the surface, suitably a thickness of at least 50 Angstroms. Thicknesses above about 3000 Angstroms are unnecessary and may interfere with the microwave device.

In the process of the invention, the thin layer of SrTiO$_3$ buffer is preferably formed by deposition in a chamber having a high percentage, usually from 10 to 100% of oxygen. The pressure in the chamber is higher than practiced in the electron beam deposition process and in other deposition processes. The pressure in the chamber is at least 100 m Torr and can be as high as 2 Torr, usually about 100 to 500 m Torr.

The buffer layer may be formed by a variety of vapor deposition techniques such as on- or off-axis sputtering, metallo-organic compound vapor deposition (MOCVD) or laser ablation.

Laser ablation and off-axis sputtering provide a buffer layer the highest quality HTSC films. This may be due to several factors. Both laser ablation and off-axis sputtering are conducted at fairly high pressures. In the case of laser ablation the deposition chamber contains from 20 to 100% oxygen at a pressure typically from 0.1 Torr up to several Torr. The higher oxygen pressure could provide a more stable, more perfect crystalline epitaxial layer. Laser ablation generates its own plasma. The charged ionic species may assemble the SrTiO$_3$ into a more ordered crystal form. The laser is pulsed during laser ablation. During the non-pulsed period the growing crystal can relax to allow the metal and oxygen atoms to assume their positions in the crystal lattice of strontium titanate.

The HTSC film is preferably grown by off-axis sputtering, ablation or MOCVD. Any of these procedures can be used to form the buffer layer. A common chamber can be used to form the buffer layer and HTSC film by two consecutive laserablation depositions or two consecutive off-axis sputtering depositions.

In off-axis sputtering the sapphire substrate or the buffer layer coated sapphire substrate is placed on a heated substrate holder in a sputtering chamber at an angle of at least 40°, usually 90°, from the sputtering source. The substrate is heated to a temperature of from about 650K to 800K. The chamber contains from 10-50% of an oxidizing gas such as oxygen or nitrous oxide. The vapor source is a composite ceramic in the correct stoichiometric ratio for the film such as a Y$_1$-Ba$_2$Cu$_3$ alloy or a SrTiO$_3$crystal or pressed powder source. Deposition is usually conducted over several hours at a high pressure between 100 and 500 Torr. A post deposition treatment in oxygen at a temperature from 400K to 600K can be conducted in case of the HTSC film.

The films of high critical temperature ($T_c$) superconducting materials (HTSC) prepared in the present invention are metal cuprates having a $T_c$ above about 30K, usually above 70K. The HTSC materials have an ordered lattice and are usually crystalline ceramics of the general formula

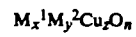

$$M_x^1 M_y^2 Cu_z O_n$$

where M$^1$ is a Group IIIA metal, Group IIIB metal, Group VB or a rare earth metal, M$^2$ is a Group IIA metal and x, y, z and n are integers. Usually the ratio of y:x is about 2:1 and the ratio of z:x is at least 3 usually from 3:1 to 6:1. The oxygen is present in an amount to satisfy valency of the metals and n is usually no more than 20, typically about 5-15.

M$_1$ can be a Group IIIA metal such as Yttrium (Y) or lanthanum (La), a Group IIIB metal such as Thallium (Tl), or Group VB metal such as Bismuth (Bi) or a rare earth metal such as Erbium (Er), Cerium (Ce), Praseodymium (Pr), Samarium (Sm), Europium (Eu), Gadolinium (Gd), Terbium (Tb), Dysprosium (Dy), Holmium (Ho), Ytterbium(Yb), Lutetium (Lu) or combinations of these metals. M$^2$ is a Group IIA metal such as strontium, barium, calcium or mixtures thereof.

The examples of practice of the invention will be directed to the YBaCuO materials of the general formula $Y_1Ba_2Cu_3O_7$, but the invention is equally applicable to other HTSC materials of the cuprate family such as the Bismuth cuprate of the general formula BiSrCaCuO or the thallium cuprate of the general formula TlBaCaCuO.

The invention will now be illustrated by specific examples. 500 Angstrom thick films of $YBa_2Cu_3O_7$ (123) were grown on 500 Angstrom thick buffer layers of $SrTiO_3$. The structural and electrical properties are characterized by x-ray diffraction data, SEM images and AC mutual inductance responses.

Both laser ablation and off-axis sputtering techniques were utilized in growing low surface resistance "123" films on $Al_2O_3$ with $SrTiO_3$ buffer layers. In the case of laser ablation about 1.8 joule/cm² energy density of 248 nm wavelength pulsed excimer laser beam was focused on a $SrTiO_3$ or an "123" pellet. Other deposition parameters were 200 m Torr of oxygen pressure and 750 C substrate temperature. In the case of offaxis sputtering two sputtering guns were mounted face to face and the substrates were glued on a heater that faces perpendicular to the both $SrTiO_3$ and "123" targets. Oxygen pressure of 40 m Torr and Argon pressure of 160 m Torr were used at the substrate temperature of 740 C.

In order to measure surface resistance at microwave frequency a parallel plate resonator was formed by sandwiching two 1 cm by 1 cm "123" thin films face to face with a 12.5 $\mu m$ thick teflon dielectric in between. This resonator generates a series of transverse electromagnetic modes. The advantage of this method is that the current and field distribution can be calculated and the relation between the measured Q factor and the surface resistance $R_s$ can be deduced in a straightforward fashion. This method has ben successfully used to measure 20 $\mu\Omega$ for Nb films at 4.2K at 10 GHz. The resolution of this method is about 5 $\mu\Omega$ at 10 GHz.

Figure 2:
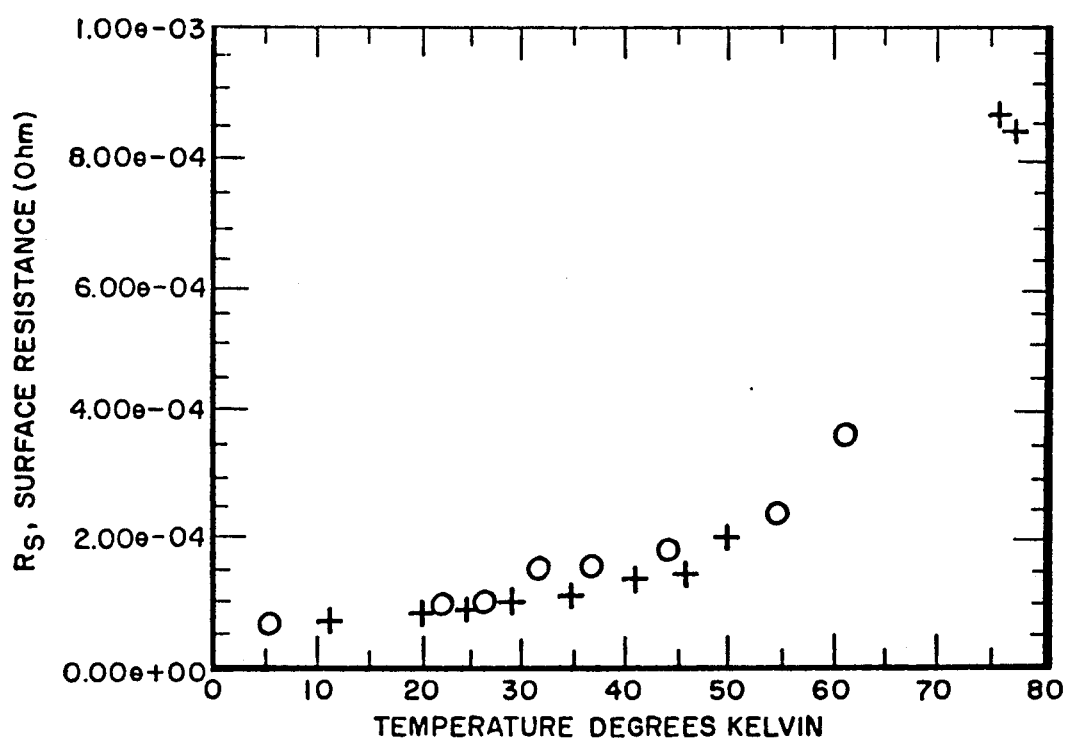
FIG. 2 is a series of curves showing Surface Resistance, $R_s$ of epitaxial YBa$_2$Cu$_3$O$_7$ films as a function of temperature at 10 GHz.

FIG. 2 shows the temperature dependence of surface resistance $R_s$ of the "123" films grown on $SrTiO_3$ buffer layers on $Al_2O_3$ (1102) substrates. The circles denote the data on a pair of films made by laser ablation and the crosses represent the data on films grown by the off-axis sputtering technique. They have a residual resistance of about 65 $\mu\Omega$ at low temperature and about 800 $\mu\Omega$ at 77K at 10 GHz. The actual resonance frequency (w) was about 11 GHz and the usual $R_s(w) \propto w^2$ relation was used to scale back to 10 GHz.

Figure 3:
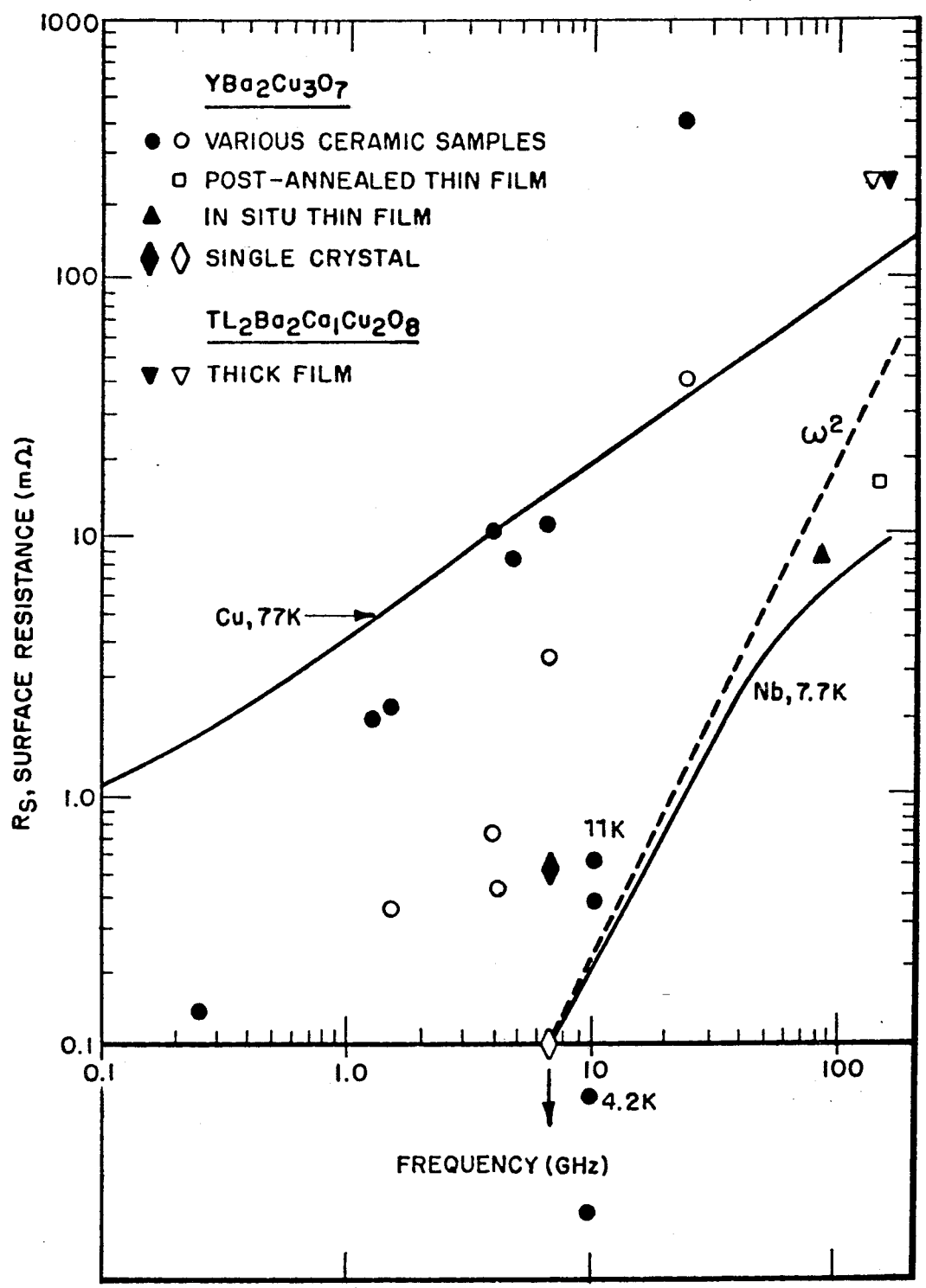
FIG. 3 is a series of plots of Surface Resistance, $R_s$ vs. frequency with Cu data at 77K and Nb data at 7.7K.

These surface resistance values are compared to those of Cu at 77K and Nb at 7.7K in FIGS. 3a and 3B. The resistance range 65 to 200 $\mu\Omega$ between 10K and 50K is lower than the Nb 7.7K value at 10 GHz. The 800 $\mu\Omega$ at 77K is also at least a factor 10 better than that of Cu at 77K.

Figure 4A:
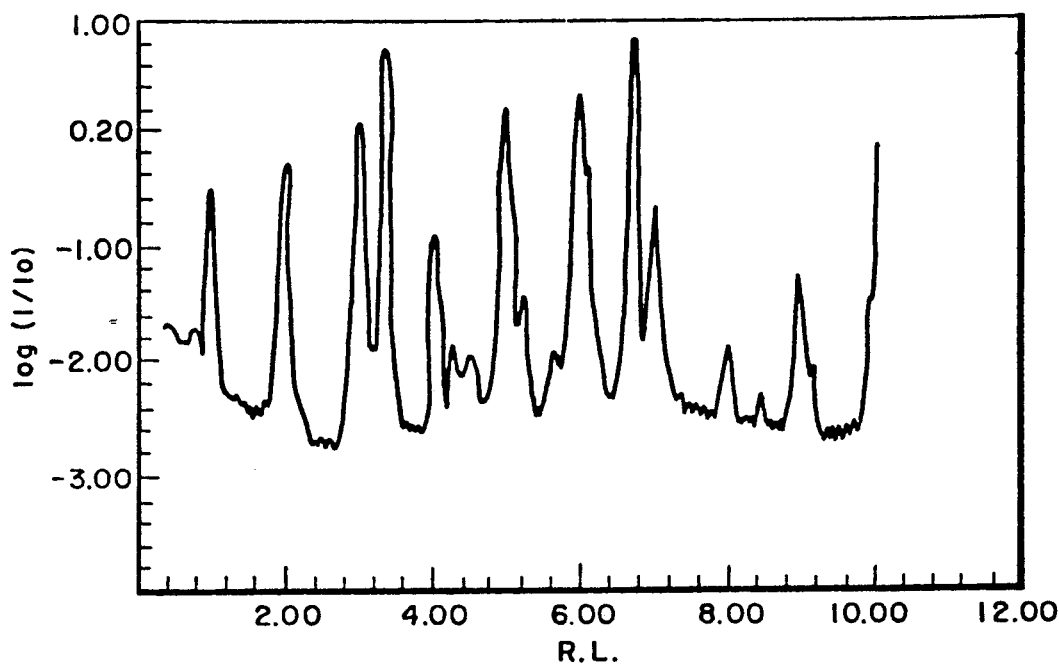
FIG. 4(a) is a c-axis scan of the YBa$_2$Cu$_3$O$_7$ film.
Figure 4B:
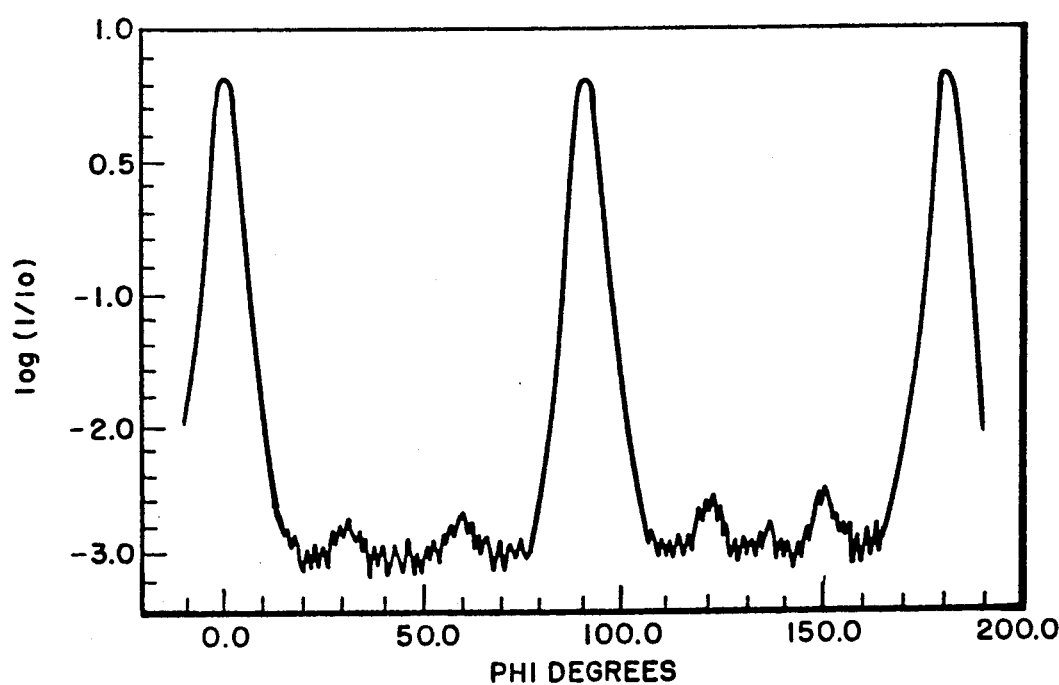
FIG. 4(b) is a $\phi$-axis scan of the [103]peak of the YBa$_2$Cu$_3$O$_7$ film.

For structural information x-ray diffraction data of a c-axis scan and a $\phi$ scan of the (103) peak are shown in FIGS. 4a and 4b. The c-axis scan shows that the samples are well aligned in the c-axis direction. The existence of (200) peaks means that there are some a-axis oriented grains in the sample. A SEM (Scanning Electron Microscope) image reveals that these a-axis oriented grains reside on the surface mostly as isolated grains. The rocking curve of the (005) peak is about 2.4 degree wide, which is not much different from the epitaxial "123" films on bare sapphire.

The big difference in microstructure between epitaxial "123" think films with $SrTiO_3$ buffer layer and films without $SrTiO_3$ buffer layer can be found in the $\phi$-scan of (103) peak in FIG. 4b. The sharp peaks every 90 degree means that the a-axis and b-axis are also aligned in the sapphire plane {1102}. The full width at half maximum, $^\wedge \phi$, of the peaks in the $\phi$-scan is about 3.8 degree. In comparison, $^\wedge \phi$ of good epitaxial films on MgO, $SrTiO_3$ is about 1.5 degree. However, unlike the data of the "123" thin films on bare sapphire [4], these peaks do not have the shoulders. In other words, the "123" films with a $SrTiO_3$ buffer layer have better in-plane epitaxy than those without a $SrTiO_3$ buffer layer.

It is known that the I-V characteristics of the grain boundary of two misaligned grains have Josephson junction behavior. It was further found by a weakly coupled grain model that these grain boundaries lead to higher surface resistance as well as longer penetration depth. Improved in-plane epitaxy can be interpreted as reduction of grain boundaries, which results in lower surface resistance.

Figure 5A:
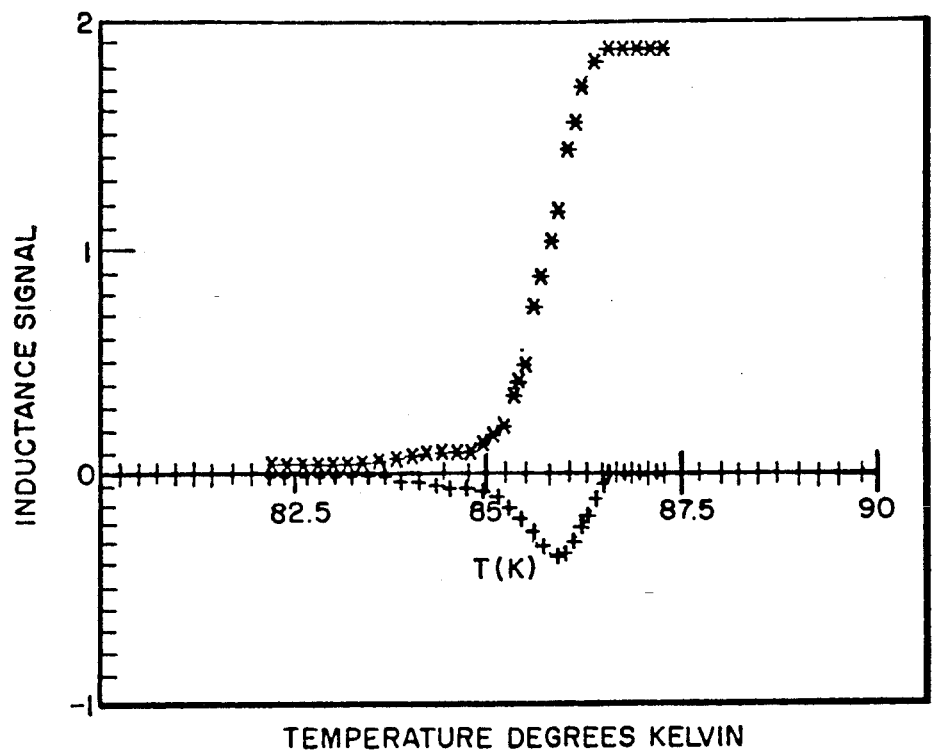
FIG. 5(a) is the mutual inductance response of the YBa$_2$Cu$_3$O$_7$ film at 1 mA.
Figure 5B:
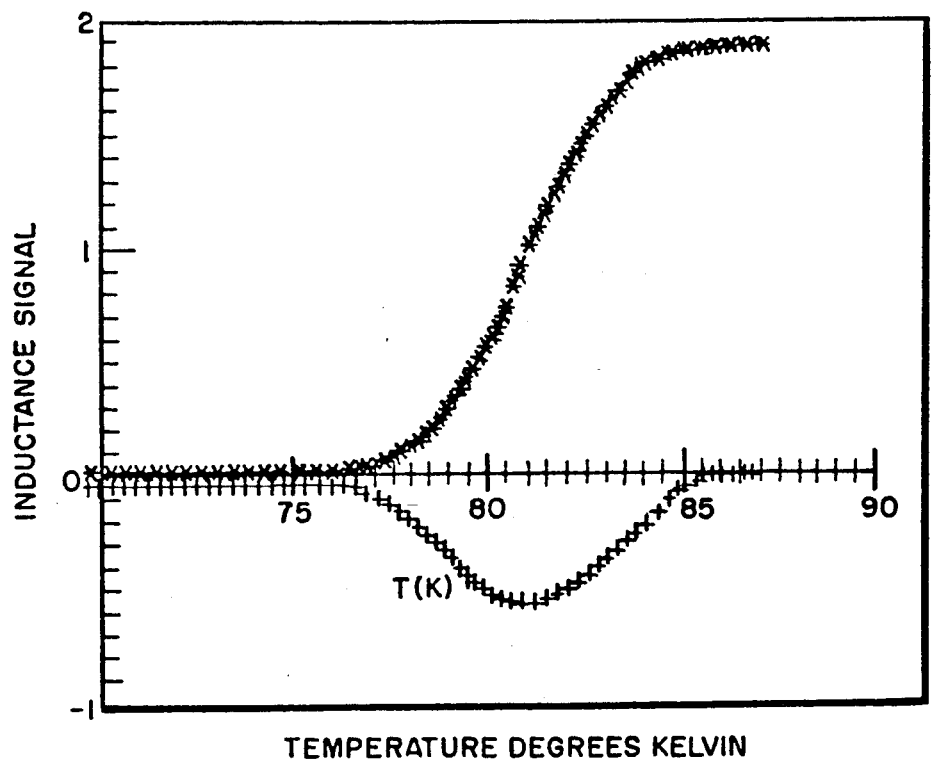
FIG. 5(b) is the mutual inductance response of the YBa$_2$Cu$_3$O$_7$ film at 100 mA.

The mutual inductance response of a film as a function of temperature is shown at FIG. 5. It was measured at 1 kHz with a maximum magnetic field of 0.6 Gauss on the film surface. The 86.5K, where the mutual inductance transition starts, is in good agreement with the temperature where the dc resistivity goes to zero.

In summary, low surface resistance 65 $\mu\Omega$ at 4.2K and 800 $\mu\Omega$ at 77K at 10 GHz were exhibited by the epitaxial $YBa_2Cu_3O_7$ films on 500 Å thick buffer layers of $SrTiO_3$ on $Al_2O_3$ {1102} substrates. Improved microwave surface resistance data are believed to be the results of better in-plane epitaxy due to the presence of the $SrTiO_3$ buffer layer.

It is to be realized that only preferred embodiments of the invention have been described and that numerous substitutions, modifications and alterations are permissible without departing from the spirit and scope of the invention as defined in the following claims.

What is claimed is:

1. A superconducting structure comprising:
   a single crystal sapphire substrate;
   a thin epitaxial, buffer layer of single crystalline strontium titanate having a thickness of no more than 3000 Angstroms deposited on a surface of the substrate; and
   a thin film of epitaxial, crystalline, high temperature, metal cuprate superconductor having an ordered lattice and a $T_c$ above about 30K deposited on the surface of the buffer layer, said film having better in-plane epitaxy than a high temperature superconductor film grown directly on the surface of the sapphire substrate.

2. A structure according to claim 1 in which the film is in the form of a pattern.

3. A structure according to claim 2 in which the buffer layer has a thickness of at least 50 Angstroms.

4. A structure according to claim 3 in which the film has a thickness of at least 100 Angstroms.

5. A structure according to claim 4 in which the superconductor is a cuprate of the formula:

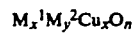

$M_x^1M_y^2Cu_zO_n$ where $M^1$ is a Group IIIA metal, Group IIIB metal, Group VB or a rare earth metal, $M_2$ is a Group IIA metal and x, y, z and n are integers.

6. A structure according to claim 5 in which $M^1$ is selected from yttria, lanthanum, thallium, bismuth, erbium, cerium, praseodymium, samarium, europium, gadolinium, terbium, dysprosium, holmium, ytterbium, lutetium or combinations thereof.

7. A structure according to claim 6 in which $M^2$ is selected from barium, strontium, calcium or mixtures thereof.

8. A structure according to claim 7 in which $M^1$ is yttria and $M^2$ is barium.

9. A structure according to claim 8 in which the superconductor is $Y_1Ba_2Cu_3O_7$.

* * * * *